United States Patent [19]

Zerod et al.

[11] Patent Number: 4,978,926
[45] Date of Patent: Dec. 18, 1990

[54] AUDIO LIMITER USING VOLTAGE MULTIPLEXED FEEDBACK

[75] Inventors: Richard D. Zerod; Gregory R. Hamel, both of Livonia, Mich.

[73] Assignee: Ford Motor Company, Dearborn, Mich.

[21] Appl. No.: 454,601

[22] Filed: Dec. 21, 1989

[51] Int. Cl.⁵ .............................................. H03G 3/20
[52] U.S. Cl. ..................................... 330/279; 330/284
[58] Field of Search ................ 330/51, 129, 133, 135, 330/149, 278, 279, 284; 455/174

[56] References Cited

U.S. PATENT DOCUMENTS

| | | | |
|---|---|---|---|
| 3,891,933 | 6/1975 | Suzuki et al. | 330/2 |
| 4,048,573 | 9/1977 | Evans et al. | 330/2 |
| 4,233,566 | 11/1980 | Nestorovic | 330/59 |
| 4,318,053 | 3/1982 | Sondermeyer | 330/281 |
| 4,581,589 | 4/1986 | Ikoma | 330/280 |
| 4,724,396 | 2/1988 | Taylor, Jr. et al. | 330/10 |
| 4,746,876 | 5/1988 | Sibiga | 330/284 |
| 4,754,230 | 6/1988 | Schwartz et al. | 330/279 |

Primary Examiner—Steven Mottola
Attorney, Agent, or Firm—Mark Mollon; Paul K. Godwin

[57] ABSTRACT

An audio system having a main chassis including an audio preamplifier and a remote chassis including a power amplifier has a clipping level detector circuit in the remote chassis for detecting the onset of clipping by the power amplifier and has a gain control element in the main chassis for controlling the gain of the preamplifier. An extra control line in the wiring harness connecting the main chassis and the remote chassis is avoided by multiplexing the clipping signal and the mute control signal on a single control wire.

7 Claims, 2 Drawing Sheets

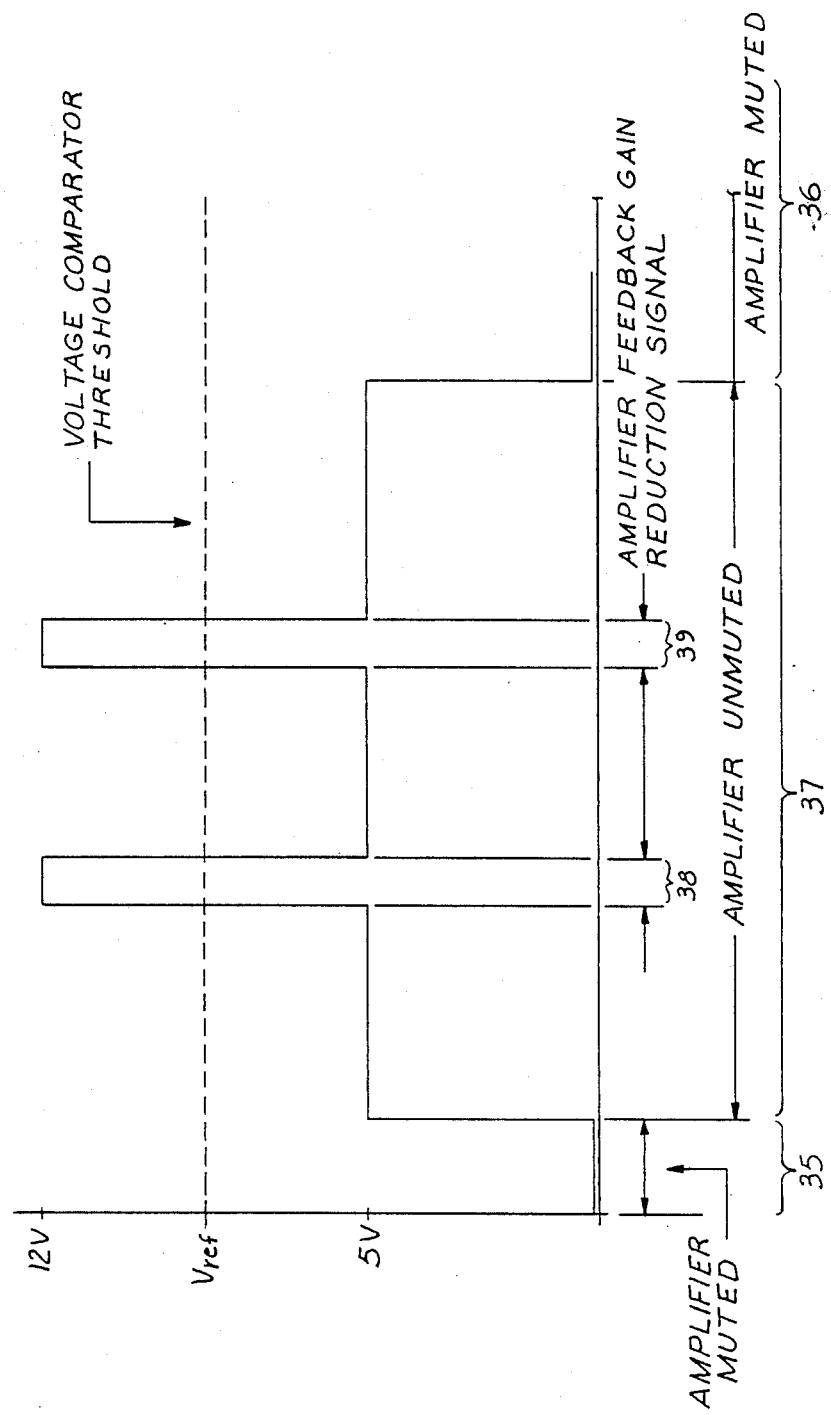

4,978,926

AUDIO LIMITER USING VOLTAGE MULTIPLEXED FEEDBACK

BACKGROUND OF THE INVENTION

The present invention relates in general to audio systems employing voltage limiting to prevent clipping distortion in an amplifier, and more specifically to an audio system having a power amplifier in a remote location from a main unit wherein the onset of clipping of the audio signal in the power amplifier is detected and causes a reduction in the audio signal in the main unit, in order to prevent further clipping. This application is related to copending application Serial Number (07/454,600) filed concurrently herewith, the entirety of which is incorporated herein by reference.

High performance automotive audio systems typically employ a power amplifier located remote from the main audio unit in the dashboard, where it is not visible to the occupants of the automobile. A remotely located power amplifier saves space in the dashboard and reduces the amount of heat that would otherwise be generated in the main unit.

The copending application teaches a voltage limiting arrangement wherein power amplifier clipping in the remote power amplifier stage causes a reduction in the signal at the preamplifier in the main unit. Thus, clipping distortion is eliminated in the reproduced audio signal without the addition of other distortion that results when using separate limiters within each series amplifier stage.

In the copending application, a clip signal generated by a clip detector in the remote stage is transmitted to a gain control in the main unit using a dedicated control wire running between the remote stage and the main unit. The control wire is thus included in a wiring harness connecting the main unit and the remote stage. However, the addition of another wire in the harness may be a disadvantage where wiring costs, harness size, and complexity are a concern.

SUMMARY OF THE INVENTION

Accordingly, it is a principal object of the present invention to transmit a clipping feedback signal from a remote amplifier stage to a main unit without increasing the size of the wiring harness interconnecting the two.

It is another object of the present invention to provide a method and an apparatus to multiplex a plurality of remote amplifier control signals on a single control wire in the wiring harness.

These and other important objects of the invention are achieved by multiplexing the clipping feedback signal with the muting signal which is also transmitted from the main unit to the remote stage in order to inhibit power amplifier operation during times that no valid audio signal is being output by the main unit. Such times include periods when a radio is being scan tuned or a tape player is being rewound. The multiplexing of these two signals is particularly advantageous since there is no time conflict between the two signals, i.e., when the power amplifier is muted there is no need for a clipping signal.

More specifically, the invention provides an audio system for amplifying an audio signal comprising a main chassis, a remote amplifier stage, a mute control line, and at least one audio line. The mute control line transmits a mute signal from the main chassis to the remote amplifier stage. The audio line transmits the audio signal from the main chassis to the remote amplifier stage. The main chassis includes preamplifier means, mute control means, voltage comparator means, and gain control means. The preamplifier means amplifies the audio signal. The mute control means is connected to the mute control line for driving the mute control line with a first voltage to cause a muted state of the audio system and for driving the mute control line with a second voltage to cause an unmuted state of the audio system. The voltage comparator means is connected to the mute control line for comparing a voltage present on the mute control line with a reference voltage and for generating a gain reduction signal depending on the result of the comparison. The gain control means is connected to the preamplifier means and to the voltage comparator means for reducing the magnitude of the audio signal at the output of the preamplifier means in response to the gain reduction signal. The audio signal magnitude at the output of the preamplifier means can be reduced by reducing the gain of the preamplifier means or, alternatively, by attenuating the audio signal at the input of the preamplifier means.

The remote amplifier stage includes power amplifier means, amplifier muting means, and clip detector means. The power amplifier means is connected to the audio line for amplifying the audio signal by a substantially fixed gain. The amplifier muting means is connected to the power amplifier means and to the mute control line for muting an audio output of the power amplifier means in response to the first voltage being present on the mute control line. The clip detector means is connected to the power amplifier means and the mute control line for driving the mute control line with a third voltage whenever the fixed gain amplification of the audio signal results in signal clipping. The reference voltage has a magnitude between the second and third voltages.

BRIEF DESCRIPTION OF THE DRAWINGS

The novel features of the invention are set forth with particularity in the appended claims. The invention itself, however, both as to its organization and method of operation, together with further objects and advantages thereof, may best be understood by reference to the following description taken in conjunction with the accompanying drawings, in which:

FIG. 3 is a waveform diagram illustrating operation of the present invention.

DETAILED DESCRIPTION OF PREFERRED EMBODIMENTS

Figure 1:
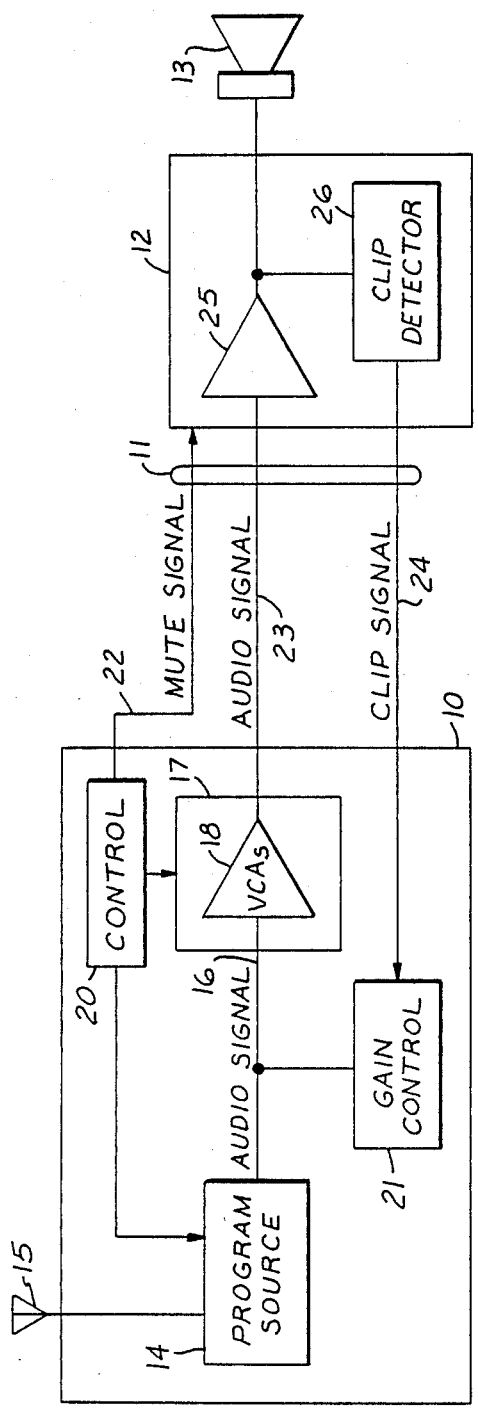
FIG. 1 is a block diagram showing the voltage limited audio amplifier arrangement of the copending application.

Referring to FIG. 1, a main chassis 10 is connected by a wiring harness 11 to a remote amplifier stage 12. Remote amplifier stage 12 drives a speaker 13. Main chassis 10 includes a program source 14 which preferably includes a radio tuner connected to an antenna 15, a tape player, a CD player, or the like. An audio signal is provided from program source 14 over an audio line 16 to a voltage controlled amplifier (VCA) 18. Although four audio signals corresponding to front and rear stereo signals may actually be present, a single audio line 16 is shown for simplicity of explanation. VCA 18 is preferably included as part of a tone/volume control integrated circuit 17, such as the TDA1524A manufactured by Philips. A control circuit 20 is connected to and supervises the operation of tone/volume circuit 17 and program source 14, and may include a microprocessor, for example. Control 20 further transmits a mute signal on a line 22 in wiring harness 11. VCA 18 transmits the amplified audio signal to remote stage 12 over an audio line 23 in wiring harness 11.

Remote amplifier stage 12 includes a power amplifier 25 receiving at its input the audio signal from line 23. Remote stage 12 is connected to mute line 22 such that the output of power amplifier 25 is inhibited in response to the mute signal.

A clip detector 26 in remote stage 12 is connected to the output of power amplifier 25 and to a line 24 in wiring harness 11. A clip signal is transmitted on line 24 from clip detector 26 to a gain control 21 in main chassis 10. Gain control 21 is further connected to line 16 at the input of VCA 18.

In operation, the onset of clipping in power amplifier 25 is sensed by clip detector 26 which sends a clip signal to gain control 21 over line 24. In response to clipping, gain control 21 attenuates the audio signal provided to the input of VCA 18 by an amount sufficient to eliminate clipping. However, the inclusion of an additional wire in wiring harness 11 may be undesirable in those circumstances discussed above.

Figure 2:
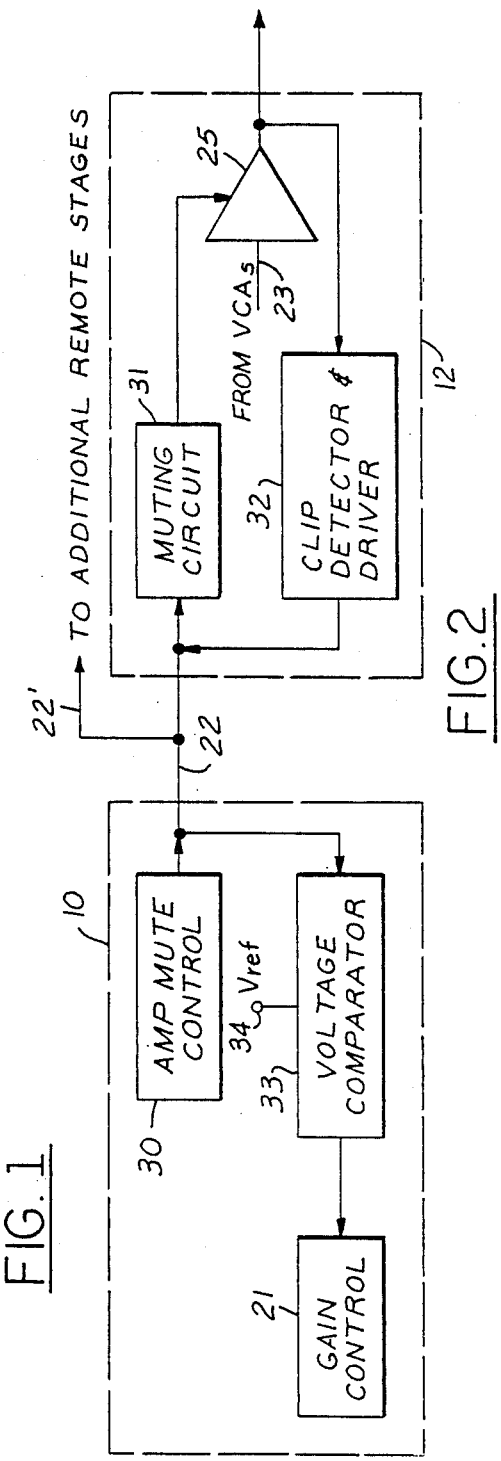
FIG. 2 is a block diagram showing the voltage multiplexed feedback system according to the present invention.

The present invention avoids the need for an additional control wire in wiring harness 11 by multiplexing the mute control line in the manner shown in general in FIG. 2. The present invention takes advantage of the fact that when the power amplifier is muted, no clipping could occur. Therefore, a voltage multiplexing scheme using three distinct voltage levels on control line 22 is employed. Specifically, the first voltage represents an amplifier muted condition, a second voltage represents an unmuted and non-gain-reduced condition, and a third voltage represents an unmuted and gain-reduced condition.

As shown in FIG. 2, main chassis 10 includes an amplifier mute control 30 connected to control line 22. Remote stage 12 includes a muting circuit 31 connected to control line 22 to receive the mute signal transmitted from mute control 30. Muting circuit 31 is further connected to power amplifier 25 in order to inhibit the output of power amplifier 25 in response to the mute signal for the purpose of preventing spurious audio output during radio tuning or cassette fast forward or rewind, for example.

Remote stage 12 further includes a clip detector and driver 32 connected to the output of power amplifier 25 and connected to control line 22. Clip detector and driver 32 compares the peak output voltage of amplifier 25 to a predetermined reference value indicative of the onset of clipping. Whenever clipping is detected, clip detector and driver 32 applies a voltage to control line 22 which is transmitted to main chassis 10 to indicate that the audio signal at the preamplifier should be reduced.

Main chassis 10 further includes a voltage comparator 33 connected to control line 22 and to gain control 21. Voltage comparator 33 is also connected to a terminal 34 having a reference voltage $V_{ref}$. Voltage comparator 33 compares the voltage level on control line 22 with reference voltage $V_{ref}$. Reference voltage $V_{ref}$ is selected to be intermediate of the magnitude of the unmute command voltage and the clip indicating signal which are driven on control line 22 by mute control 30 and clip detector and driver 32, respectively. In response to the clip signal, voltage comparator 33 activates gain control 21.

FIG. 3 shows the relative voltages appearing on control line 22 for various operating conditions of the audio system. Control line 22 is at zero volts (i.e., at ground potential) during a segment 35 whereby the amplifier output is muted. Muting circuit 31 (FIG. 2) is responsive to a control line voltage of about five volts or greater to allow unmuted operation of the power amplifier, as shown at segment 37. During clipping, the clip detector and driver increases the control line voltage to about 12 volts, shown at segments 38 and 39, thus exceeding the reference voltage $V_{ref}$. In this manner, the clip signal appears on control line 22 as a plurality of pulses having variable width and variable frequency of occurrence depending on the severity of the clipping in the power amplifier. The gain control reduces the gain according to an integration of these pulses. At a later time, the amplifier output is again muted at segment 36 by mute control 30, returning control line 22 to ground potential.

While preferred embodiments of the invention have been shown and described herein, it will be understood that such embodiments are provided by way of example only. Numerous variations, changes, and substitutions will occur to those skilled in the art without departing from the spirit of the invention. Accordingly, it is intended that the appended claims cover all such variations as fall within the spirit and scope of the invention.

What is claimed:

1. An audio system for amplifying an audio signal comprising:
    a main chassis;
    a remote amplifier stage;
    a mute control line coupling said main chassis and said remote amplifier stage; and
    at least one audio line coupling said audio signal from said main chassis to said remote amplifier stage;
    said main chassis including:
        preamplifier means for amplifying said audio signal;
        mute control means coupled to said mute control line for driving said mute control line with a first voltage to cause a muted state of said audio system and for driving said mute control line with a second voltage to cause an unmuted state of said audio system;
        voltage comparator means coupled to said mute control line for comparing a voltage present on said mute control line with a reference voltage and generating a gain reduction signal depending on the result of said comparison; and
        gain control means coupled to said preamplifier means and to said voltage comparator means for reducing the magnitude of said audio signal at the output of said preamplifier means in response to said gain reduction signal;
    said remote amplifier stage including:
        power amplifier means coupled to said preamplifier means for amplifying said audio signal by a substantially fixed gain;
        amplifier muting means coupled to said power amplifier means and to said mute control line for muting an audio output of said power amplifier means in response to said first voltage being present on said mute control line; and clip detector means coupled to said power amplifier means and said mute control line for driving said mute control line with a third voltage whenever said fixed gain amplification of said audio signal results in signal clipping, said reference voltage having a magnitude between said second and third voltages.

2. The system of claim 1 wherein said second voltage has a magnitude between said first and third voltages.

3. The system of claim 1 wherein said gain control means includes means for variably attenuating said audio signal input to said preamplifier means in response to said gain reduction signal.

4. The system of claim 1 further comprising a program source for generating said audio signal.

5. The system of claim 1 further comprising an output speaker coupled to said power amplifier means.

6. A method of preventing distortion in an audio system including a preamplifier on a main chassis providing an audio signal to a remote amplifier stage, said method comprising the steps of:

providing conduction path means for defining a single conduction path between said main chassis and said remote amplifier stage;

generating a clip signal upon the onset of clipping in said remote amplifier stage;

controlling the output of said remote amplifier stage from said main chassis by means of a mute control signal applied to said conduction path means from said main chassis to said remote amplifier stage;

multiplexing said clip signal and said mute control signal on said conduction path means to communicate the onset of clipping to said main chassis; and reducing the magnitude of said audio signal at the output of said preamplifier in response to said clip signal, whereby clipping in said remote amplifier is prevented.

7. The method of claim 6 wherein said clip signal is represented by a first voltage being applied to said conduction path means and wherein said mute control signal is represented by a second voltage being applied to said conduction path means.

* * * * *